United States Patent
Zeng et al.

(10) Patent No.: US 10,290,806 B2
(45) Date of Patent: May 14, 2019

(54) EVAPORATION CARRIER PLATE AND EVAPORATION DEVICE

(71) Applicant: BOE TECHNOLOGY GROUP CO., LTD., Beijing (CN)

(72) Inventors: Qinghui Zeng, Beijing (CN); Shupeng Guo, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 521 days.

(21) Appl. No.: 14/908,442

(22) PCT Filed: Sep. 11, 2015

(86) PCT No.: PCT/CN2015/089446
§ 371 (c)(1),
(2) Date: Jan. 28, 2016

(87) PCT Pub. No.: WO2016/138755
PCT Pub. Date: Sep. 9, 2016

(65) Prior Publication Data
US 2017/0005267 A1    Jan. 5, 2017

(30) Foreign Application Priority Data
Mar. 5, 2015 (CN) .................... 2015 2 0128144 U

(51) Int. Cl.
*C23C 14/50* (2006.01)
*H01L 51/56* (2006.01)
*H01L 51/00* (2006.01)

(52) U.S. Cl.
CPC .......... *H01L 51/0008* (2013.01); *C23C 14/50* (2013.01); *H01L 51/56* (2013.01)

(58) Field of Classification Search
CPC ...................................................... C23C 14/50
See application file for complete search history.

(56) References Cited

U.S. PATENT DOCUMENTS 6,765,178 B2 * 7/2004 Shang ............... H01L 21/67109
118/50.1
2001/0037761 A1 * 11/2001 Ries .................... C23C 16/0227
117/200

(Continued)

FOREIGN PATENT DOCUMENTS

| CN | 1851043 A | 10/2006 |
|---|---|---|
| CN | 204434500 U | 7/2015 |
| JP | H0697269 A | 4/1994 |

OTHER PUBLICATIONS

International Search Report and Written Opinion dated Dec. 15, 2015 regarding PCT/CN2015/089446. Translation provided by Dragon Intellectual Property Law Firm.

*Primary Examiner* — Aiden Lee
(74) *Attorney, Agent, or Firm* — Harness, Dickey & Pierce, P.L.C.

(57) ABSTRACT

The present disclosure provides an evaporation carrier plate and an evaporation device. The evaporation carrier plate includes a carrier plate body. The carrier plate body includes a glass-carrying surface and a plurality of pin holes for pins to extend through. The evaporation carrier plate further includes a cover plate arranged on a surface of the carrier plate body away from the glass-carrying surface and configured to move relative to the carrier plate body to cover or open the pin holes.

2 Claims, 5 Drawing Sheets

(56) References Cited

U.S. PATENT DOCUMENTS

| | | | |
|---|---|---|---|
| 2002/0092144 A1* | 7/2002 | Nguyen | C23C 16/44 29/25.01 |
| 2007/0029642 A1 | 2/2007 | Inagawa et al. | |
| 2008/0041819 A1* | 2/2008 | Kim | B08B 7/0035 216/67 |
| 2009/0064934 A1* | 3/2009 | Park | C23C 16/4401 118/723 R |
| 2011/0045617 A1* | 2/2011 | Kang | C23C 14/044 438/22 |
| 2012/0227666 A1 | 9/2012 | Kim | |

* cited by examiner

EVAPORATION CARRIER PLATE AND EVAPORATION DEVICE

CROSS-REFERENCE TO RELATED APPLICATIONS

This application is the U.S. national phase of PCT Application No. PCT/CN2015/089446 filed on Sep. 11, 2015, which claims a priority to Chinese Patent Application No. 201520128144.5 filed on Mar. 5, 2015, the disclosures of both of which are incorporated in their entirety by reference herein.

TECHNICAL FIELD

The present disclosure relates to the field of manufacturing organic light-emitting devices, and in particular to an evaporation carrier plate and an evaporation device.

BACKGROUND

In a process of manufacturing an organic light-emitting device, an evaporation performed on a glass substrate is an important technical process.

A device for evaporating a glass substrate of an organic light-emitting device includes an evaporation chamber, an evaporation source arranged in the evaporation chamber, and an evaporation carrier plate for carrying the glass substrate. At present, when evaporating the glass substrate of the organic light-emitting device, generally, a surface of the glass substrate on which the evaporation is performed faces down and the evaporation source faces up, thereby avoiding particles falling in the evaporating chamber from influencing the organic light-emitting device itself. That is, when the glass substrate is evaporated by the evaporation device, a glass-carrying surface of the glass carrier plate faces to the evaporation source, and pin holes are arranged in the evaporation carrier plate for pins to extend through. When the evaporation is finished, the evaporation carrier plate is turned over, so as to make the glass-carrying surface of the glass carrier plate face up, and then the pins of a pin device are controlled to extend through the pin holes in the evaporation carrier plate to lift up the glass substrate, so as to separate the glass substrate from the glass-carrying surface of the evaporation carrier plate.

However, because the pin holes are arranged in the evaporation carrier plate, when the glass substrate is evaporated in the evaporation chamber of the evaporation device, radiant signals emitted from the evaporation source, after being reflected by an upper wall of the evaporation chamber, may irradiate at the glass substrate through the pin holes of the evaporation carrier plate, such that temperatures of different parts of the glass substrate are not uniform. Black spot badness may occur at positions corresponding to the pin holes when the organic light-emitting device performs a display, and a quality of the organic light-emitting device may be degraded.

SUMMARY

The present disclosure provides an evaporation carrier plate and an evaporation device, which can improve a quality of the glass substrate subjected to an evaporation, thereby improving a product quality of an organic light-emitting device.

To achieve the above object, the technical scheme of the present disclosure provides an evaporation carrier plate including a carrier plate body. The carrier plate body includes a glass-carrying surface and a plurality of pin holes for pins to extend through. The evaporation carrier plate further includes a cover plate arranged on a surface of the carrier plate body away from the glass-carrying surface and configured to move relative to the carrier plate body to cover or open the pin holes.

In the evaporation carrier plate hereinabove, when the evaporation carrier plate carrying the glass substrate is arranged in an evaporation chamber of the evaporation device, the glass-carrying surface of the carrier plate body faces to the evaporation source in the evaporation chamber. As this point, the cover plate of the evaporation carrier plate may cover the pin holes arranged in the carrier plate body, thereby preventing radiant signals from passing through the pin holes to be irradiated at a surface of the glass substrate (attached onto the glass-carrying surface of the carrier plate body) facing to the carrier plate body, and then the glass substrate may be heated uniformly and a yield of the evaporation performed on the glass substrate may be improved and the a product quality of the organic light-emitting device may be improved.

Optionally, the cover plate includes a plurality of sub-cover plates, and each of the sub-cover plates is mounted on the carrier plate body by a pivotal shaft arranged at a side edge of each of the sub-cover plates.

Optionally, each of the sub-cover plates rotates around a central axis of the pivotal shaft by an angle smaller than 90 degrees.

Optionally, the cover plate further includes a drive device configured to drive the sub-cover plates to rotate.

Optionally, the drive device is a servo motor, a cylinder or a drive motor.

Optionally, each of the sub-cover plates covers one pin hole.

Optionally, at least one of the sub-cover plates covers at least two pin holes.

Optionally, the pin holes in the carrier plate are arranged as an array, and each of the sub-cover plates covers a row of pin holes.

Optionally, an extension direction of the pivotal shaft of each of the sub-cover plates is parallel to a row direction of the pin holes.

Optionally, the cover plate includes elastic cushions corresponding to the pin holes in a one-to-one manner; each of the elastic cushions includes a plurality of splicing petals arranged at a position of the each of the elastic cushions opposite to the corresponding pin hole. When one pin is extended through the corresponding pin hole, the splicing petals of the each of the elastic cushions are subjected to elastic deformation under action of the one pin, so as to make the one pin extend through the pin hole. When the one pin is not extended through the corresponding pin hole, the splicing petals of the each of the elastic cushions are spliced with each other to cover the corresponding pin hole In addition, an evaporation device is further provided by the present disclosure, including an evaporation chamber, an evaporation source arranged in the evaporation chamber, and the evaporation carrier plate according to any one provided in the technical scheme hereinabove. The evaporation device further includes a supporting mechanism arranged in the evaporation chamber, and the evaporation carrier plate is arranged on the supporting mechanism.

DETAILED DESCRIPTION

Technical solutions of the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
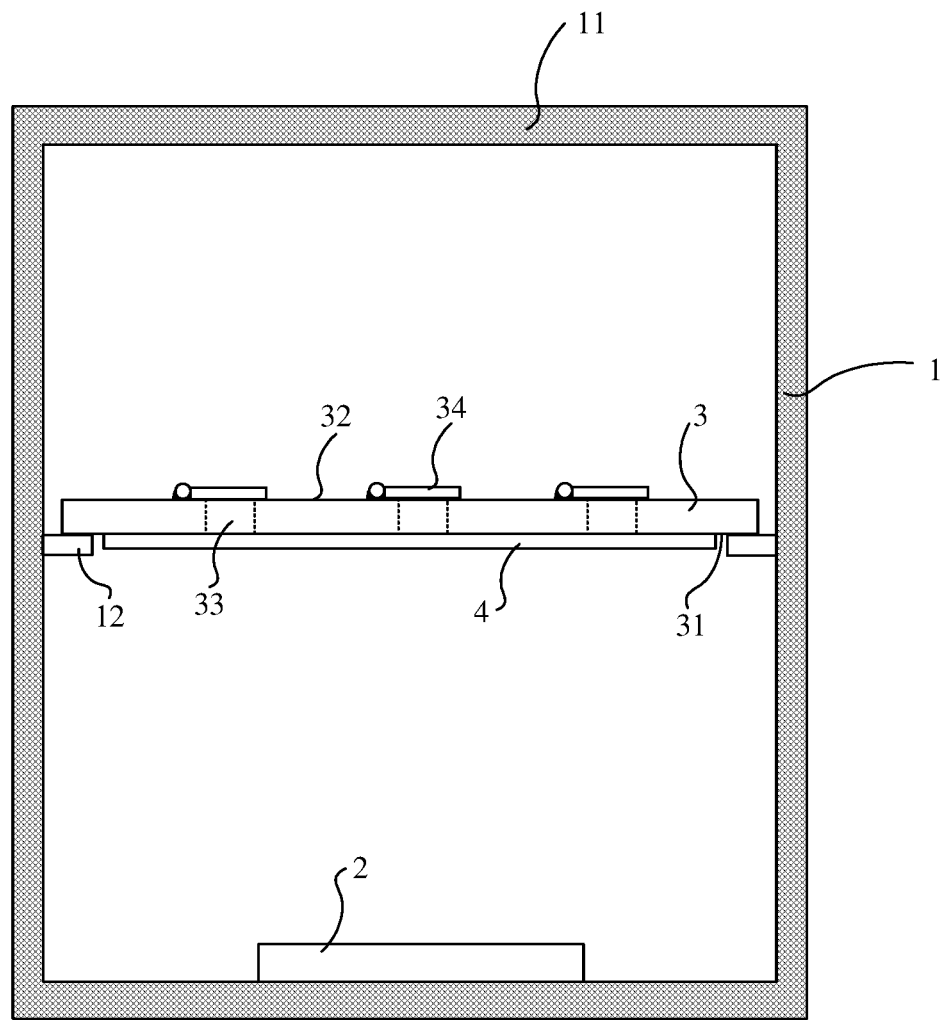
FIG. 1 is a schematic view showing an evaporation carrier plate provided by some embodiments of the present disclosure.
Figure 2:
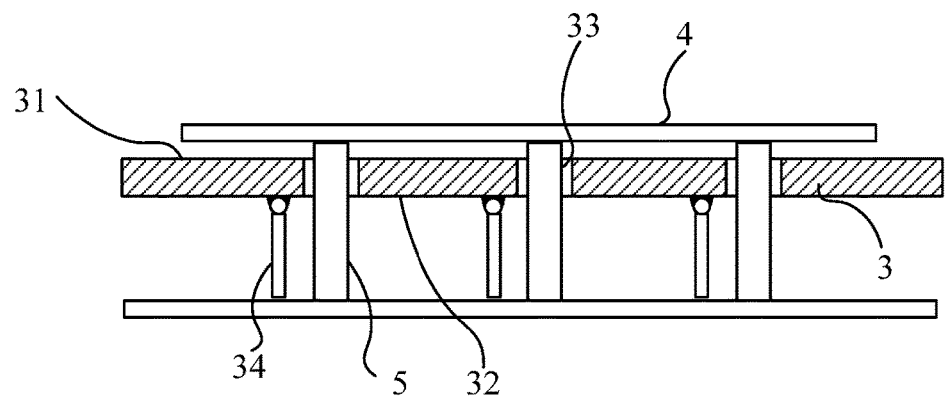
FIG. 2 is a schematic view showing a situation that an evaporation performed on a glass substrate carried by the evaporation carrier plate shown in FIG. 1 is finished and the glass substrate is lifted away from a glass-carrying surface of the evaporation carrier plate by pins.

Referring to FIGS. 1-2, an evaporation carrier plate provided by one embodiment of the present disclosure includes a carrier plate body 3. The carrier plate body 3 includes a glass-carrying surface 31 and a plurality of pin holes 33 for pins 5 to extend through. A cover plate 34, which covers the pin holes 33 when the glass-carrying surface 31 faces to an evaporation source 2, is arranged on a surface 32 of the carrier plate body 3 away from the glass-carrying surface 31.

Referring to FIG. 1, when evaporating a glass substrate 4 attached onto glass-carrying surface 31, the carrier plate body 3 is arranged in an evaporation chamber 1 of the evaporation device with the glass-carrying surface 31 of the carrier plate body 3 facing to the evaporation source 2. As this point, the cover plate 34 covers the pin holes 33 defined in the carrier plate body 3, thereby preventing radiant signals from passing through the pin holes 33 to be irradiated at a surface of the glass substrate 4 (attached onto the glass-carrying surface 31 of the carrier plate body 3) facing to the carrier plate body 3, and then the glass substrate 4 may be heated uniformly and a yield of the evaporation performed on the glass substrate 4 may be improved. When the evaporation performed on the glass substrate 4 is finished, as shown in FIG. 2, the carrier plate body 3 of which the glass-carrying surface 31 is attached with the glass substrate 4 is taken away from the evaporation chamber 1, and then the carrier plate body 3 is turned over to make the glass-carrying surface 31 of the carrier plate body 3 face up (when the carrier plate body 3 and the glass substrate 4 are arranged in a position as shown in FIG. 2). The cover plate 34 is opened to make the pin holes 33 open, and then the pins 5 may extend through the pin holes 33 to lift the glass substrate 4 away from the carrier plate body 3.

Therefore, when the glass substrate 4 is carried by the evaporation carrier plate hereinabove, the glass substrate 4 may be heated uniformly when being evaporated, thereby improving a quality of the glass substrate 4 after being evaporated and then improving a product quality of the organic light-emitting device formed by the glass substrate 4.

Optionally, the cover plate 34 of the evaporation carrier plate hereinabove may include a plurality of sub-cover plates, and each of the sub-cover plates is mounted on the carrier plate body 3 by a pivotal shaft 342 arranged at a side edge of each of the sub-cover plates.

Optionally, each of the sub-cover plates of the cover plate 34 may rotate around a central axis of the pivotal shaft 342 by an angle smaller than 90 degrees. In the evaporation carrier plate hereinabove, because each of the sub-cover plates may rotate around the central axis of the pivotal shaft 342 by an angle smaller than 90 degrees, thus, when the carrier plate body 3 is turned over with the glass-carrying surface 31 facing down, each sub-cover plate may only rotate around the central axis of the pivotal shaft along a direction to cover the pin holes 33, thereby guaranteeing that each of the sub-cover plates may cover the corresponding pin hole 33.

Optionally, the cover plate 34 hereinabove may further include a drive device configured to drive the sub-cover plates to rotate.

The sub-cover plates of the cover plate 34 hereinabove may be driven by the drive device to rotate, as a result, the rotation of the sub-cover plates may be controlled more accurately.

Figure 7:
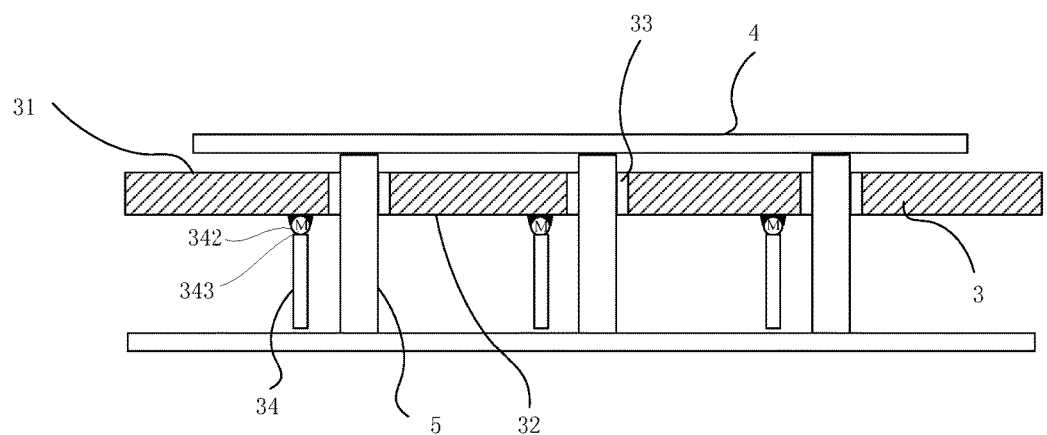
FIG. 7 is similar to FIG. 2, which further shows a drive device configured to drive the cover plates to rotate.

To be specific, the drive device hereinabove may be a servo motor, a cylinder or a drive motor. For example, as shown in FIG. 7, the drive device may be a drive motor 343 coaxially arranged with the pivotal shaft 342.

Figure 3:
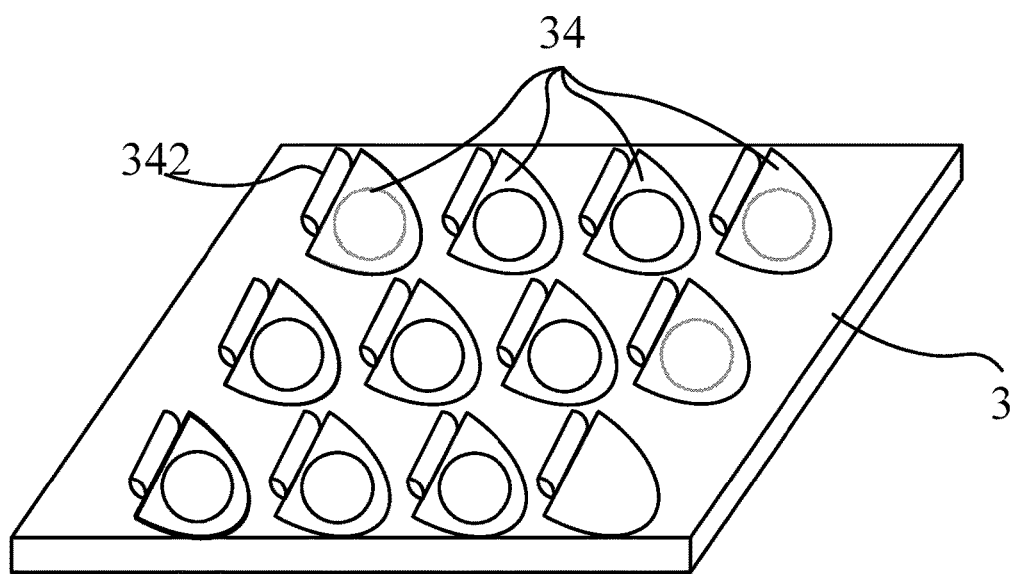
FIG. 3 is a schematic view of an evaporation carrier plate provided by some embodiments of the present disclosure, showing a cover plate of the evaporation carrier plate covering pin holes of the evaporation carrier plate.
Figure 4:
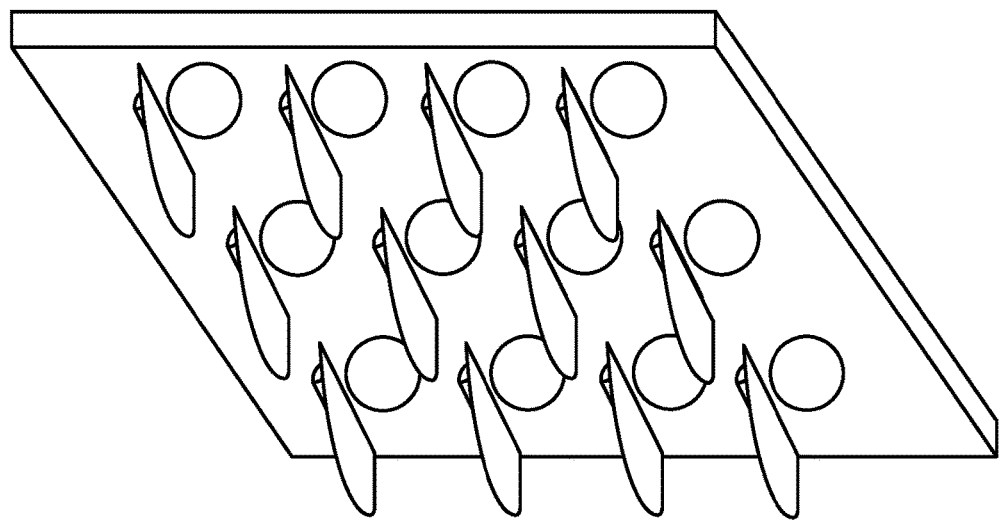
FIG. 4 is a schematic view showing a situation that the cover plate of the evaporation carrier plate shown in FIG. 3 is opened and the pin holes of the evaporation carrier plate are open.

In one embodiment of the present disclosure, as shown in FIG. 3, each sub-cover plate of the cover plate 34 covers one pin hole 33 when the glass-carrying surface 31 of the carrier plate body 3 faces to the evaporation source 2. The state of each of the sub-cover plates is shown in FIG. 4 when the glass-carrying surface 31 of the carrier plate body 3 faces up.

Figure 5:
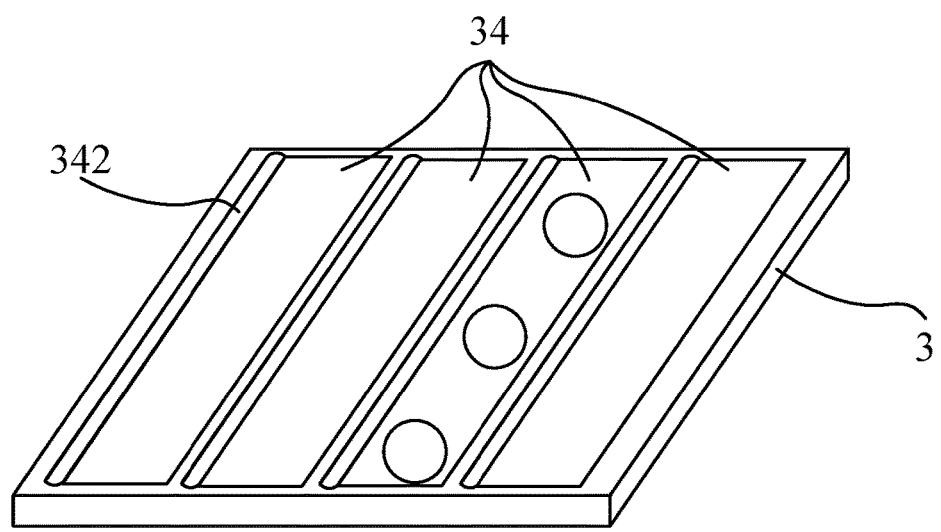
FIG. 5 is a schematic view of an evaporation carrier plate provided by some embodiments of the present disclosure, showing a cover plate of the evaporation carrier plate covering pin holes of the evaporation carrier plate.

Of course, in another embodiment of the present disclosure, as shown in FIG. 5, there exists at least one sub-cover plate which covers at least two pin holes 33 when the glass-carrying surface 31 of the carrier plate body 3 faces to the evaporation source 2. The state of each of the sub-cover plates is shown in FIG. 6 when the glass-carrying surface 31 of the carrier plate body 3 faces up.

Optionally, the pin holes 33 defined in the carrier plate body 3 are arranged as an array, and each of the sub-cover plates of the cover plate 34 covers a row of pin holes 33 or a column of pin holes 33 when the glass-carrying surface 31 of the carrier plate body 3 faces to the evaporation source 2.

Figure 6:
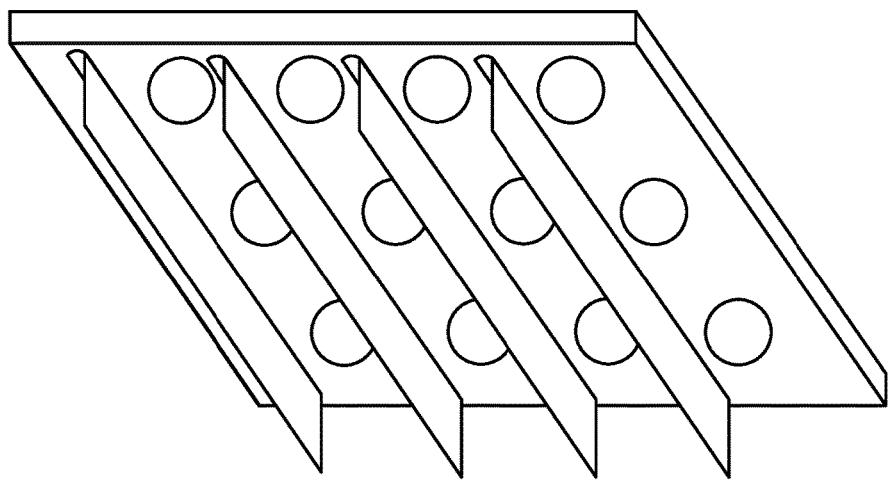
FIG. 6 is a schematic view showing a situation that the cover plate of the evaporation carrier plate shown in FIG. 5 is opened and the pin holes of the evaporation carrier plate are open.

Optionally, when the glass-carrying surface 31 of the carrier plate body 3 faces to the evaporation source 2 and each of the sub-cover plates covers a row of pin holes 33, an extension direction of the pivotal shaft 342 of each of the sub-cover plates is parallel to a row direction of the pin holes 33, as shown in FIG. 5 and FIG. 6.

According to the evaporation carrier plate hereinabove, when the pin hole 33 is open after the sub-cover plate is opened, space occupied by the sub-cover plate in a direction from an upper wall 11 of the evaporation chamber 1 to the evaporation source 2 may be reduced.

In yet another embodiment of the present disclosure, when the glass-carrying surface 31 of the carrier plate body 3 faces to the evaporation source 2 and each of the sub-cover plates covers a column of pin holes 33, an extension direction of the pivotal shaft 342 of each of the sub-cover plates is parallel to a column direction of the pin holes 33.

According to the evaporation carrier plate hereinabove, when the pin hole 33 is open after the sub-cover plate is opened, space occupied by the sub-cover plate in a direction from the upper wall 11 of the evaporation chamber 1 to the evaporation source 2 may be reduced.

The sub-cover plate of the cover plate 34 provided by the embodiments hereinabove opens or covers the pin hole 33 in the evaporation carrier plate body 3 by its own gravity, thereby the operation thereof is simple.

Figure 8:
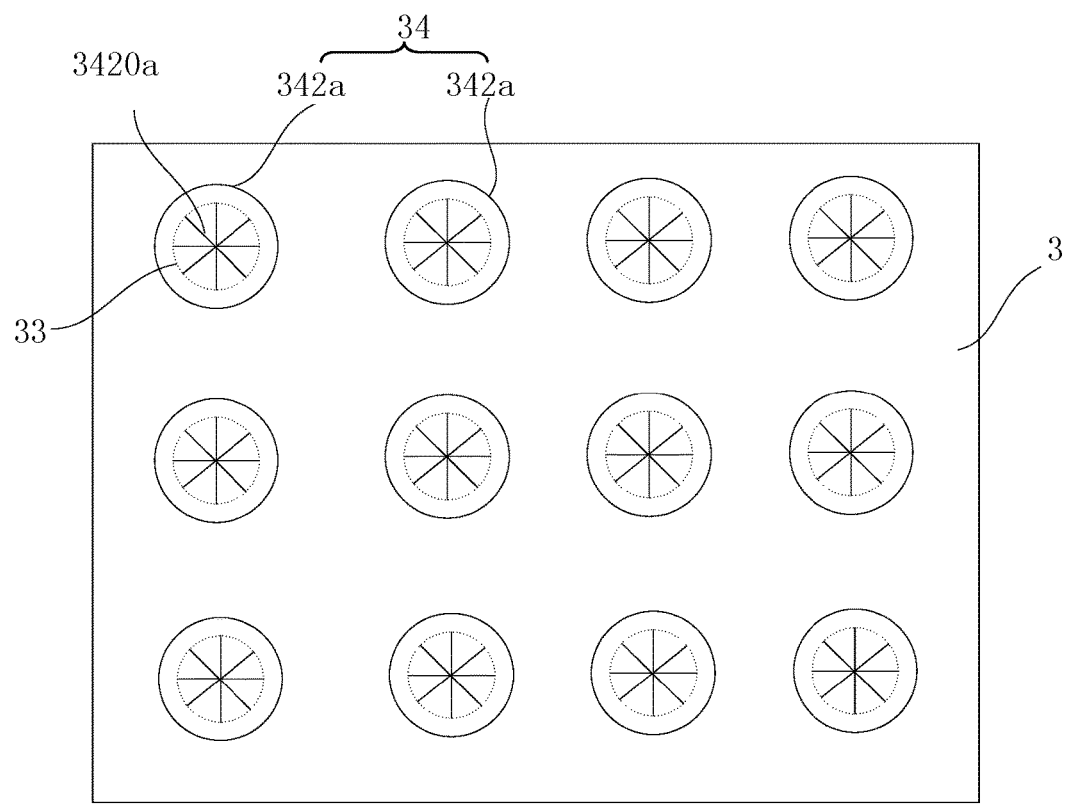
FIG. 8 is a schematic view of an evaporation carrier plate provided by some embodiments of the present disclosure, showing a cover plate of the evaporation carrier plate covering pin holes of the evaporation carrier plate.

Optionally, as shown in FIG. 8, the cover plate 34 includes elastic cushions 342a corresponding to the pin holes 33 in a one-to-one manner. Each of the elastic cushions 342a includes a plurality of splicing petals 3420a arranged at a position of the elastic cushion opposite to the pin hole. When the pin 5 is extended through the pin hole 33, under the action of the pin 5, the plurality of splicing petals 3420a of the elastic cushion 342a is subjected to an elastic deformation (which is equivalent to movement relative to the carrier plate body 3), so as to make the pin 5 extend through the pin hole 33. When the pin 5 is not extended through the pin hole 33, the plurality of splicing petals 3420a of the elastic cushion 342a is spliced with each other to cover the pin hole 33.

In addition, as shown in FIG. 1, an evaporation device is further provided by one embodiment of the present disclosure, including an evaporation chamber 1, an evaporation source 2 arranged in the evaporation chamber 1. A supporting mechanism 12 configured to support an evaporation carrier plate is arranged in the evaporation chamber 1. The evaporation device further includes the evaporation carrier plate provided by any one of the embodiments hereinabove.

Obviously, a person skilled in the art may make various modifications and improvements to these embodiments of the present disclosure without departing from the principle and spirit of the present disclosure, and these modifications and improvements shall also fall within the scope of the present disclosure if they fall with the scopes of the attached claims of the present disclosure and the equivalent technology.

What is claimed is:

1. An evaporation carrier plate comprising a carrier plate body;

wherein the carrier plate body comprises a glass-carrying surface and a plurality of pin holes for pins to extend through;

wherein the evaporation carrier plate further comprises a cover plate arranged on a surface of the carrier plate body away from the glass-carrying surface and configured to move relative to the carrier plate body to cover or open the pin holes;

wherein the cover plate comprises elastic cushions corresponding to the pin holes in a one-to-one manner; each of the elastic cushions comprises a plurality of splicing petals arranged at a position of the each of the elastic cushions directly opposite to the corresponding pin hole;

when one pin is extended through the corresponding pin hole, the splicing petals of the each of the elastic cushions are subjected to elastic deformation under action of the one pin, so as to make the one pin extend through the pin hole; and when the one pin is not extended through the corresponding pin hole, the splicing petals of the each of the elastic cushions are spliced with each other to cover the corresponding pin hole.

2. An evaporation device, comprising an evaporation chamber, an evaporation source arranged in the evaporation chamber, and an evaporation carrier plate; wherein the evaporation device further comprises a supporting mechanism arranged in the evaporation chamber, and the evaporation carrier plate is arranged on the supporting mechanism;

wherein the evaporation carrier plate comprises a carrier plate body;

wherein the carrier plate body comprises a glass-carrying surface and a plurality of pin holes for pins to extend through;

wherein the evaporation carrier plate further comprises a cover plate arranged on a surface of the carrier plate body away from the glass-carrying surface and configured to move relative to the carrier plate body to cover or open the pin holes;

wherein the cover plate comprises elastic cushions corresponding to the pin holes in a one-to-one manner; each of the elastic cushions comprises a plurality of splicing petals arranged at a position of the each of the elastic cushions opposite to the corresponding pin hole;

when one pin is extended through the corresponding pin hole, the splicing petals of the each of the elastic cushions are subjected to elastic deformation under action of the one pin, so as to make the one pin extend through the pin hole; and when the one pin is not extended through the corresponding pin hole, the splicing petals of the each of the elastic cushions are spliced with each other to cover the corresponding pin hole.

* * * * *